United States Patent
Claprood et al.

(10) Patent No.: US 7,040,491 B1
(45) Date of Patent: May 9, 2006

(54) TECHNIQUES FOR MANAGING A SET OF CABLES

(75) Inventors: Edward J. Claprood, Southborough, MA (US); Barry Cavanaugh, Douglas, MA (US)

(73) Assignee: EMC Corporation, Hopkinton, MA (US)

( * ) Notice: Subject to any disclaimer, the term of this patent is extended or adjusted under 35 U.S.C. 154(b) by 158 days.

(21) Appl. No.: 10/304,935

(22) Filed: Nov. 26, 2002

(51) Int. Cl.
*A47F 7/00* (2006.01)

(52) U.S. Cl. .......................................... 211/26; 211/183
(58) Field of Classification Search .................. 211/26; 361/829, 657, 724, 725, 752, 826; 174/50, 174/58, 63, 65 G; 248/906; 220/4.02; 439/535
See application file for complete search history.

(56) References Cited

U.S. PATENT DOCUMENTS

| | | | | |
|---|---|---|---|---|
| 4,428,645 A | * | 1/1984 | Korbelak et al. ........... | 385/135 |
| 4,516,493 A | * | 5/1985 | Schemenauer ............... | 101/27 |
| 4,993,970 A | * | 2/1991 | Littrell ....................... | 439/535 |
| 5,808,866 A | * | 9/1998 | Porter ........................ | 361/695 |
| 5,949,640 A | * | 9/1999 | Cameron et al. ........... | 361/600 |
| 6,028,267 A | * | 2/2000 | Byrne ......................... | 174/59 |
| 6,097,591 A | * | 8/2000 | Ircha .......................... | 361/683 |
| 6,102,733 A | * | 8/2000 | Anderson et al. ........... | 439/535 |
| 6,356,436 B1 | * | 3/2002 | Buican et al. .............. | 361/683 |
| 6,621,692 B1 | | 9/2003 | Johnson et al. ............. | 361/683 |
| 6,626,507 B1 | * | 9/2003 | Dean ....................... | 312/223.2 |
| 6,693,371 B1 | * | 2/2004 | Ziegler et al. ............... | 307/64 |
| 6,762,362 B1 | | 7/2004 | Cavanaugh et al. ....... | 174/68.2 |
| 2002/0118514 A1 | * | 8/2002 | Coglitore et al. ........... | 361/724 |

* cited by examiner

*Primary Examiner*—Jennifer E. Novosad
(74) *Attorney, Agent, or Firm*—BainwoodHuang; David E. Huang, Esq.

(57) ABSTRACT

A cable management system has a chassis, a communications interface and an access panel assembly. The cable management system a chassis which is configured to hold a set of circuit boards. The communications interface is disposed adjacent a side of the chassis. The access panel assembly is coupled to the side of the chassis and is disposed adjacent the communications interface. The access panel assembly includes (i) a frame portion which defines a frame opening, (ii) a set of bushings coupled to the frame portion, the set of bushings defining a set of cable ports and an access port within the frame opening defined by the frame portion, and (iii) a cover portion which is configured to substantially cover the access port defined by the set of bushings.

22 Claims, 7 Drawing Sheets

TECHNIQUES FOR MANAGING A SET OF CABLES

BACKGROUND OF THE INVENTION

A typical electronic equipment rack includes a vertically extending frame which supports multiple components. Each component typically includes a housing, and electronic circuitry (e.g., a set of circuit boards, an array of disk drives, etc.) which is contained within that housing. Such an equipment rack is well-suited for supporting a variety of electronic systems such as a general purpose computer system, a data storage system, network equipment, test equipment, power supply equipment, as well as other types of electronic equipment.

In general, component manufacturers for electronic equipment racks design the components such that (i) control and display functions are accessible at the fronts of the components (e.g., keyboards, control buttons, LEDs, CRTs, etc.), and (ii) cables connect to the backs of the components (e.g., power cords, communication lines, etc.). Accordingly, after installation of the components, a user can conveniently operate the components from the front of the equipment rack without disturbing the cables running from the back of the equipment rack. For example, with such a design, the user does not need to worry about tripping over wires or inadvertently disconnecting a cable, etc.

Some component manufacturers provide components having equipment housings with substantially contiguous metal sides and/or backs to decrease the amount of electromagnetic interference (EMI) which emanates from the electronic circuitry during operation. These metal sides and backs function as EMI shields and, without such shielding, the component circuitry would release EMI into the surrounding areas which could affect the operation of other components in the vicinity (e.g., the released EMI could prevent neighboring radio equipment from properly receiving a communications signal, or corrupt network signals traveling through cables adjacent the back of the equipment rack, etc.). Furthermore, particular agencies and committees (e.g., the FCC, ISO, ANSI, etc.) have set rudimentary standards which manufacturers must comply with or attempt to comply with depending upon the circumstances (e.g., depending on the application, location, zoning, etc.).

Some component manufacturers provide components having housings with removal metallic plates on the backs of the housings. The plates are removable to allow technicians to get into the housings, e.g., to probe equipment during operation, to operate special switches, to replace components, etc.

If the components require cables, some manufacturers design their housings with circular or oval-shaped holes in the plates or in the walls of the chassis to enable the technicians to run cables therethrough. Other manufacturers design gaps along the edges of the plates so that the technicians can maneuver the cables through the edge-located gaps when mounting the plates to the housings.

SUMMARY OF THE INVENTION

Unfortunately, there are deficiencies to using the above-described conventional electronic equipment rack components which require cables that run from the backs of the component housings. For example, in the case where the manufacturer provides circular or oval-shaped holes in the metallic plates or in the walls of the housings, the technicians must meticulously feed the ends of the cables through holes in order to properly run the cables. Such operation may require a significant and painstaking amount of manual effort and time. Additionally, during such operation, the technician runs the risk of scraping the sides of the cables against the plates or the housing walls (i.e., along the hole edges) and damaging the cables (e.g., tearing the insulation from the cables).

In extreme situations, some technicians may view the tasks of feeding the cables through the circular or oval-shaped holes as being too burdensome, and decide not to invest the time and effort to properly install the cables through such holes. As an alternative, these technicians may simply run the cables through the open areas which are normally hidden by the plates, and leave the plates off of the housings thus omitting the EMI protection.

Furthermore, in the case where the manufacturer provides gaps along the edges of the plates so that the technicians can maneuver the cables through the edge-located gaps when mounting the plates to the housings, the cables can later brush against the plates. In some situations, the force of the cables against the plates can be so severe (e.g., due to movement of the equipment rack caused by vibration, due to pulling on the other ends of the cables, etc.) that the plates inadvertently become dislodged from the chassis and no longer properly provide EMI protection.

The present invention is directed to techniques for managing a set of cables passing through a frame opening using a set of bushings which defines both a set of cable ports and an access port within the frame opening. Accordingly, the frame opening can be utilized for both locating cables (e.g., through the set of cable ports), as well as for other forms of access (e.g., manual access through the access port by a technician plugging or unplugging cable connectors) in a well-organized manner.

One embodiment of the invention is directed to a cable management system having a chassis, a communications interface and an access panel assembly. The chassis is configured to hold a set of circuit boards (i.e., one or more circuit boards). The communications interface is disposed adjacent a side of the chassis. The access panel assembly is coupled to the side of the chassis and is disposed adjacent the communications interface. The access panel assembly includes (i) a frame portion which defines a frame opening, (ii) a set of bushings coupled to the frame portion, the set of bushings defining a set of cable ports and an access port within the frame opening defined by the frame portion, and (iii) a cover portion which is configured to substantially cover the access port defined by the set of bushings. In this manner, the cable management system provides a well-organized mechanism that enables a user (e.g., a technician) to simultaneously (i) position the set of cables and (ii) maintain access to the communications interface (e.g., hands-on access from an external location) through the frame opening.

In one arrangement, each of (i) the frame portion, (ii) the set of bushings and (iii) the cover portion of the access panel assembly includes metallic material to form an EMI barrier. Accordingly, the access panel assembly is capable of operating as an EMI shield (e.g., in combination with other structures) to reduce EMI emissions generated by circuitry (e.g., the set of circuit boards) housed within the chassis.

In one arrangement, each bushing of the set of bushings defines a slot to permit a mid-portion of a cable to pass between the access port and a respective cable port of the set of cable ports while the mid-portion of that cable continues to extend through the frame opening. Accordingly, a user can manually pass an end of a cable from an external location of the chassis and connect that end to a connector within the chassis (e.g., a circuit board connector) through the access port, and subsequently pass a mid-portion of that cable conveniently through a slot of a bushing such that the cable now passes through a cable port rather than through the access port.

In one arrangement, the frame portion defines, as the frame opening, a substantially rectangular area. In this arrangement, each bushing of the set of bushings is disposed in a respective corner of the substantially rectangular area defined by the frame portion. Accordingly, the cables can be run to peripheral locations of the frame opening in order to leave the central region of the rectangular area relatively free for user access.

In one arrangement, each bushing of the set of bushings defines (i) a respective aperture, as one of the set of cable ports, in an X-Y plane, and (ii) a wide-radius surface to substantially support a set of cables passing through that respective aperture in a Z-direction which is substantially perpendicular to the X-Y plane. Accordingly, the wide-radius surface of each bushing can operate as a support that prevents the cables from pinching or kinking (e.g., a preventative limit on the cable bend radius for fiber optic cables). Furthermore, in some applications, the bushings can provide strain relief to prevent placing stresses on the cable ends (e.g., to avoid damaging connectors at the ends of the cables).

In one arrangement, the cover portion of the access panel assembly substantially extends in the X-Y plane. In this arrangement, each bushing includes a flange portion having the wide-radius surface. At least part of that flange portion overlaps part of the cover portion in the X-Y plane. Due to such overlap, it is less likely that electromagnetic interference will escape from the chassis.

In one arrangement, the frame portion includes a rigid metallic edge that defines the frame opening. In this arrangement, each bushing of the set of bushings includes a rigid metallic structure which rigidly fastens to the rigid metallic edge of the frame portion (e.g., using rivots, welds, etc.). Accordingly, the bushings can be robustly and reliably mounted to the frame portion.

In one arrangement, the cable management system further includes cable ties which are configured to hold a set of cables in stable positions. Each cable tie is coupled to one of the chassis, the communications interface and the access panel assembly. The use of the cable ties provides an additional vehicle for positioning the cables within the cable management system in an orderly fashion.

The features of the invention, as described above, may be employed in electronic systems, devices and methods, as well as other types of components such as those of EMC Corporation of Hopkinton, Mass.

BRIEF DESCRIPTION OF THE DRAWINGS

The foregoing and other objects, features and advantages of the invention will be apparent from the following description of particular embodiments of the invention, as illustrated in the accompanying drawings in which like reference characters refer to the same parts throughout the different views. The drawings are not necessarily to scale, emphasis instead being placed upon illustrating the principles of the invention.

DETAILED DESCRIPTION

The invention is directed to techniques for managing a set of cables (e.g., fiber optic cables, electrical signal cables, combinations thereof, etc.) using a set of bushings that defines both a set of cable ports and an access port within a frame opening. Accordingly, the frame opening is well-suited for both locating cables (e.g., through the set of cable ports), as well as for other forms of access (e.g., manual access through the access port by a technician when plugging or unplugging cable connectors) in a well-organized manner.

Figure 1:
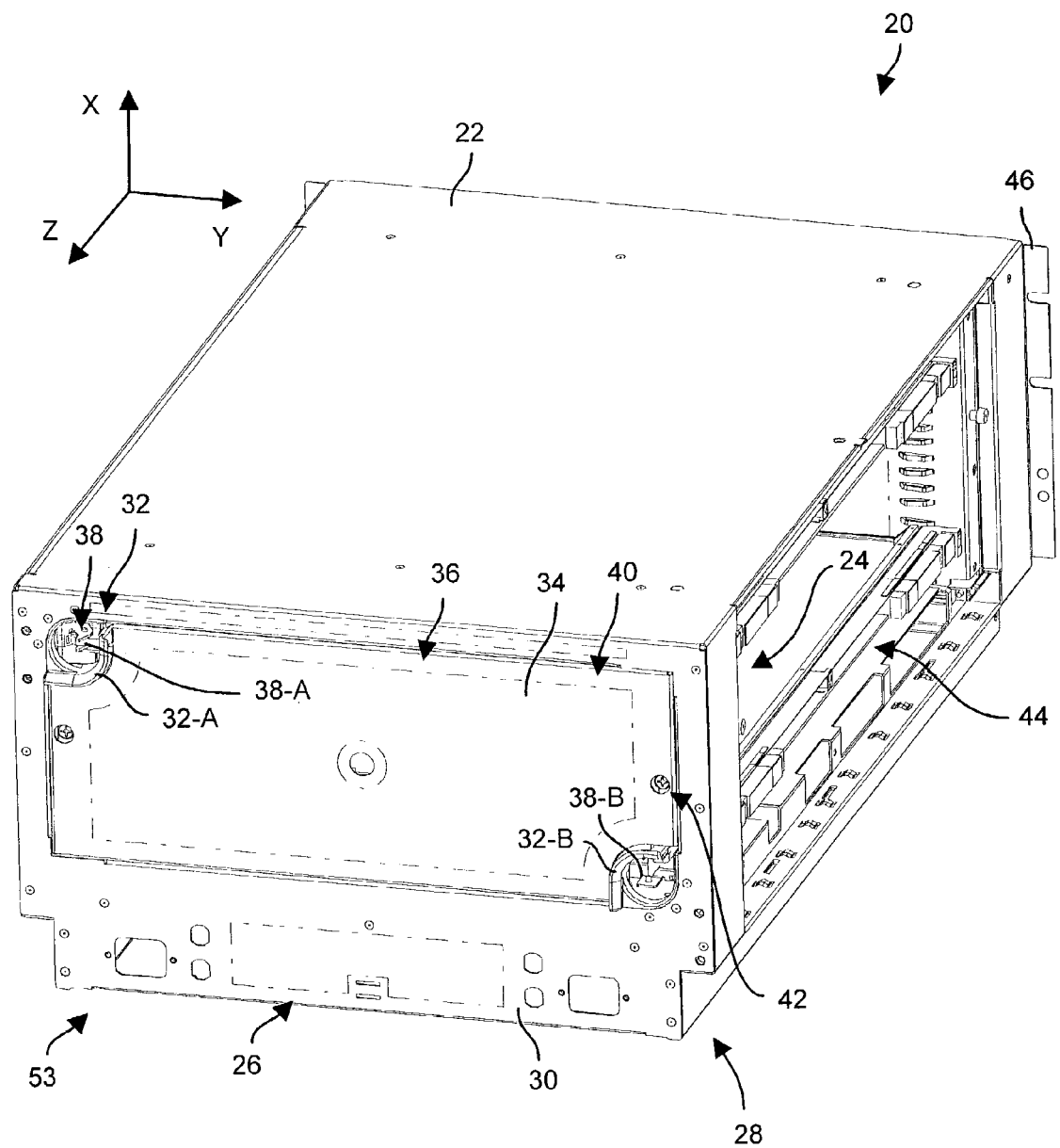
FIG. 1 is a perspective view of a cable management system which is suitable for use by the invention.

FIG. 1 shows a cable management system 20 which is suitable for use by the invention. As will be explained below, the cable management system 20 is well-configured to manage a set of cables. The cable management system 20 includes a chassis 22, a communications interface 24 (illustrated by the arrow 24 in FIG. 1), and an access panel assembly 26. The communications interface 24 is disposed along a side 28 of the chassis 22. The access panel assembly 26 couples to the side 28 of the chassis 22 and is disposed adjacent the communications interface 24. The access panel assembly 26 includes (i) a frame portion 30, a set of bushings 32-A, 32-B (collectively, bushings 32), and a cover portion 34. The frame portion 30 defines a frame opening 36 (which is substantially covered by the cover portion 34 in FIG. 1). The set of bushings 32 defines a set of cable ports 38-A, 38-B (collectively, cable ports 38) and an access port 40 within the frame opening 36. The cover portion 34 is sized and shaped so that it substantially covers the access port 40 defined by the set of bushings 32 but leaves the set of cable ports 38 uncovered to enable a set of cables to pass therethrough. In one arrangement, the cover portion 34 mounts to the frame portion 30 using hardware 42 (e.g., screws, nuts and bolts, etc.).

As shown in FIG. 1, the cover portion 34 is substantially planar in shape and extends within the X-Y plane. The cable ports 38 (e.g., one inch apertures, quarter inch apertures, etc.), which are defined by the bushings 32, are configured to enable cables to pass through the frame opening 36 along the Z-direction.

By way of example only, the chassis 22 is configured as a card cage assembly which holds a set of circuit boards 44, i.e., one or more circuit boards 44, in a substantially co-planar manner. Furthermore, by way of example only, the chassis 22 defines a set of members 46 (e.g., flanges) which enable the chassis 22 to mount to another structure (e.g., an equipment rack, a cabinet frame, etc.) using hardware (e.g., nuts and bolts, brackets, etc.). Further details of the invention will now be provided with reference to FIG. 2.

Figure 2:
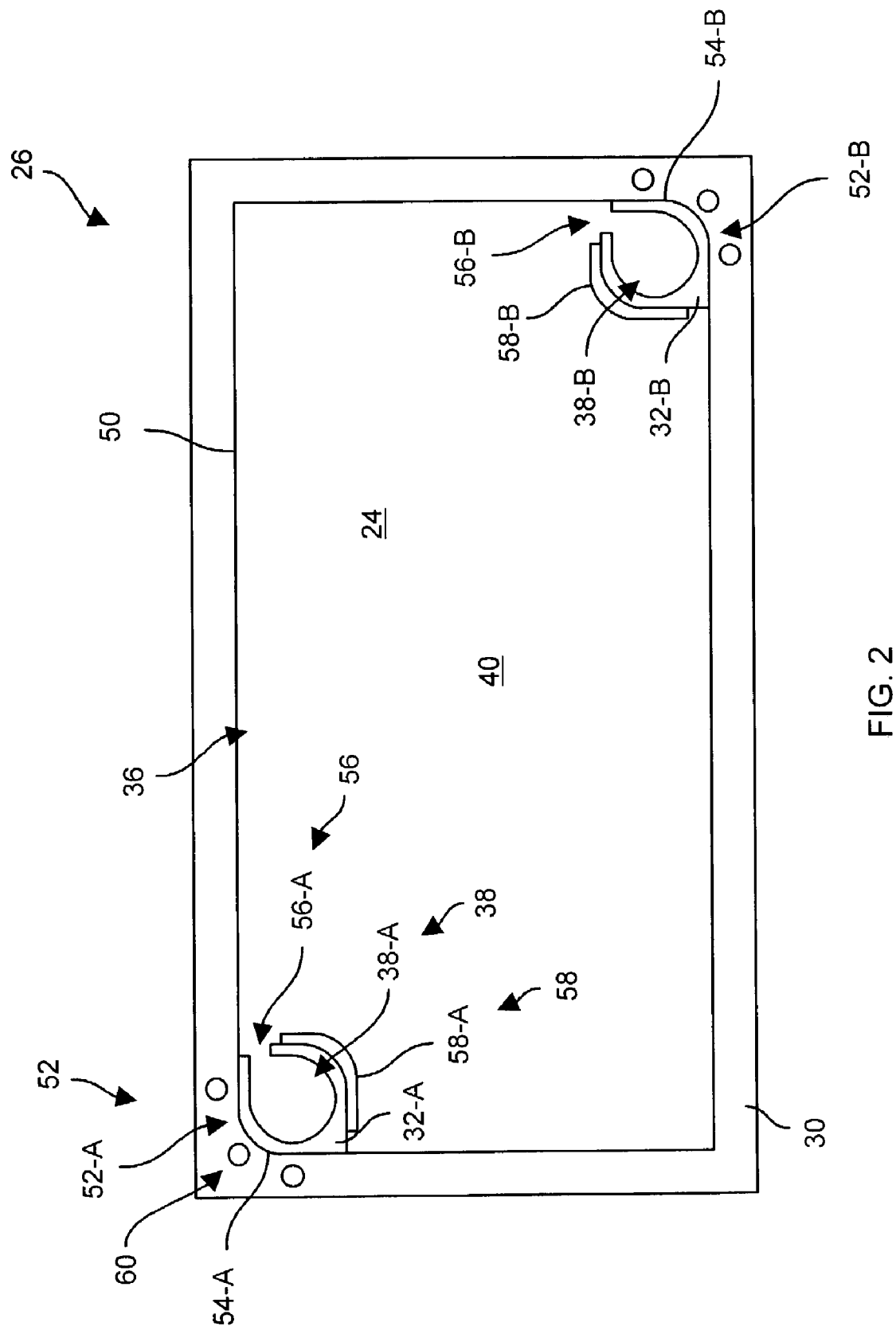
FIG. 2 is a port diagram of an access panel assembly of the cable management system of FIG. 1.

FIG. 2 shows a diagram of the access panel assembly 26 of the cable management system 20. The cover portion 34 is purposefully omitted from view in FIG. 2 to better illustrate the various sections of the frame opening 36 and to allow viewing of the communications interface 24 through the frame opening 36.

As shown in FIG. 2, the frame portion 30 is generally rectangle-shaped and defines a frame opening 36. The frame opening 36 also has a substantially rectangular-shape 50. The bushings 32 are disposed in corners 52 of the frame opening 36. In particular, the bushing 32-A is disposed in the corner 52-A, and the bushing 32-B is disposed in the corner 52-B. By way of example only, the bushings 32 and the frame portion 30 have matching curved contours 54-A, 54-B at the corners 52-A, 52-B for a robust and reliable form fit.

In some arrangements, the frame portion 30, the bushings 32 and the cover portion 34 include metallic material so that they combine to form an electromagnetic interference (EMI) shield 53 as shown in FIG. 1. In one arrangement, at least one of the frame portion 30, the bushings 32 and the cover portion 34 has a metallic coating (e.g., metallic paint) which serves as a barrier to EMI signals. In another arrangement, at least one of the frame portion 30, the bushings 32 and the cover portion 34 is substantially made of rigid metallic material (e.g., stamped, bended, welded, molded and/or machined aluminum, steel, other alloys, etc.) for preventing passage of EMI signals. Accordingly, the EMI shield 53 in combination with other EMI shielding surfaces (e.g., other sides of the chassis 22, cabinet sides, panels etc.) can form a Faraday cage that reduces EMI emissions emanating from the circuitry contained within the chassis 22.

As shown by FIG. 2, the bushings 32-A, 32-B define the set of cable ports 38-A, 38-B and the access port 40 within the frame opening 36. In particular, the cable ports 38-A, 38-B, which are well-suited for holding cables, reside in the corners (i.e., the periphery of the frame opening 36. In contrast, the access port 40, which is well-suited for enabling a user's hands to enter the chassis 22 from an external location, conveniently resides in a central region of the frame opening 36. Accordingly, the cable management system 20 provides a well-organized mechanism that enables the user (e.g., a technician) to simultaneously (i) position the set of cables and (ii) maintain access to the communications interface 24 (FIG. 1) through the frame opening 36.

As further shown in FIG. 2, each bushing 32-A, 32-B defines a respective slot 56-A, 56-B (collectively, slots 56). When the widths of the slots 56 are wider than the diameters of the cables, the cables can pass between the access port 40 and the cable ports 38 through the slots 52. For example, to install a set of cables, it is not necessary for a user to feed the end of each cable meticulously through the set of cable ports 38. Rather, the user can simply pass the cable ends through the access port 40 and subsequently loop the mid-portions of the cables through the slots 56 so that the cables then pass only through the set of cable ports 38. Similarly, to remove the set of cables, the user can initially pass the cables through the slots 56, and then pull the ends through the access port 40 rather than pull all of the cable ends through the cable ports 38.

In one arrangement, the bushings 32 include extensions 58-A, 58-B (collectively, extensions 58) to provide an interference surface upon which the cover portion 34 (FIG. 1) can abut against. Further details of the invention will now be provided with reference to FIG. 3.

Figure 3:
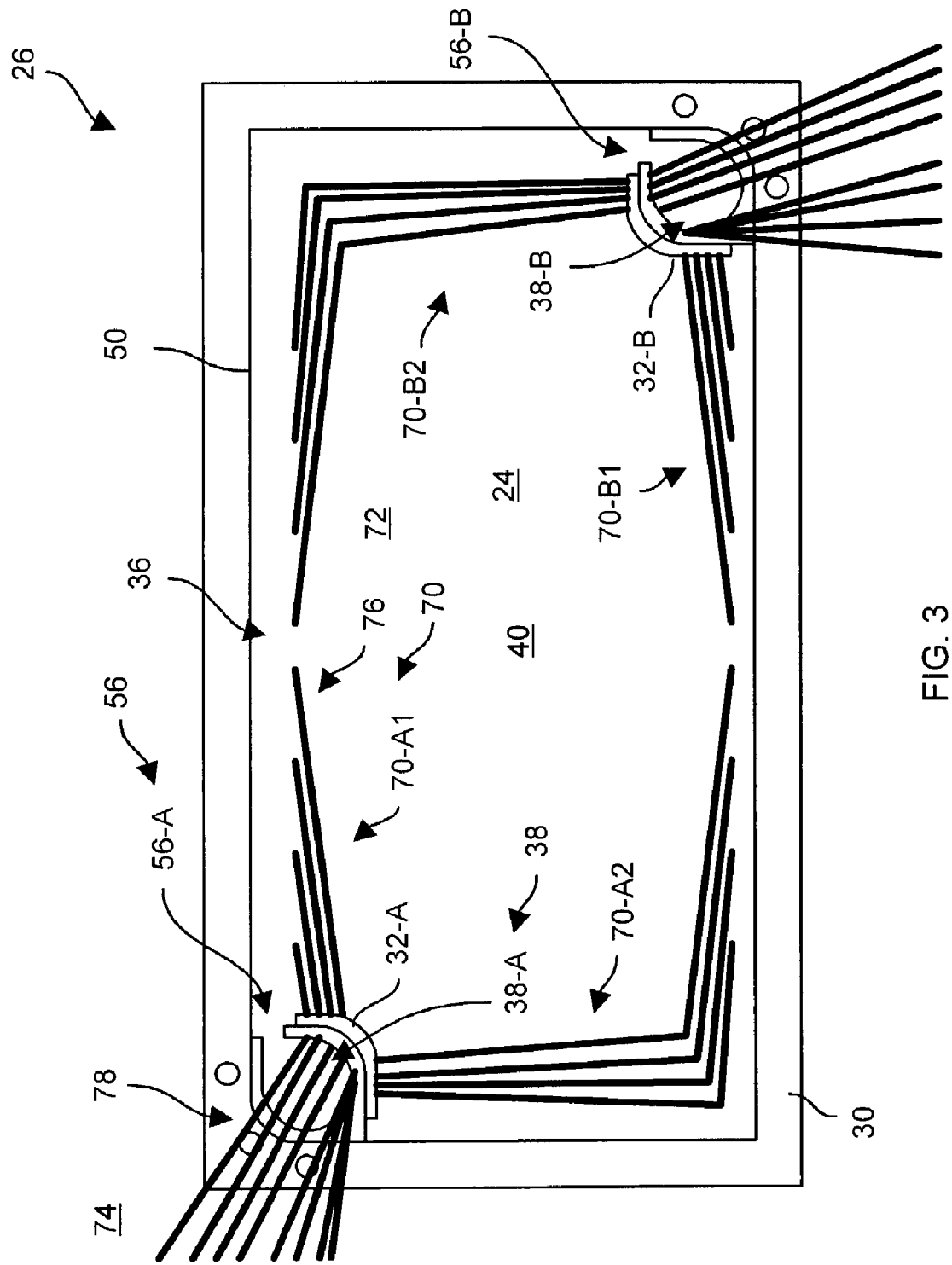
FIG. 3 is the port diagram of FIG. 2 with a set of cables shown running through the access panel assembly.

FIG. 3 shows the diagram of FIG. 2 when the cable management system 20 is in the process of managing a set of cables 70. As shown in FIG. 3, the set of cables 70 runs from an interior location 72 of the chassis 22 to one or more exterior locations 74. In one arrangement, the circuit boards 44 within the chassis 22 are processing boards for a data storage system, and disk drives and/or host systems reside at the external locations 74. Although each cable 70 is shown as a thick and substantially straight line for simplicity, it should be understood that the mid-portions 76 of the cables 70 can have varying degrees of flexibility depending on the application and the type of signal or signals they carry (e.g., fiber optic cables, power cables, digital signal cables, analog signal cables, shielded coaxial or RF cables, combinations thereof, etc.). Furthermore, it should be understood that the cables 70 can have a variety of connectors at their ends 78 (e.g., fiber optic connectors, pins, plugs, clips, coaxial connectors, etc.).

By way of example only, the cables 70 are organized into four subsets 70-A1, 70-A2, 70-B1 and 70-B2. As viewed in FIG. 3, the ends of the cable subset 70-A1 connects to a top left-hand region of the communications interface 24, and the cable subset 70-A1 runs from that top left-hand region across the top of the frame portion 30 and through the cable port 38-A defined by the bushing 32-A. The ends of the cable subset 70-A2 connects to a bottom left-hand region of the communications interface 24, and the cable subset 70-A2 runs from that bottom left-hand region across the bottom of the frame portion 30, up the left-side of the frame portion 30 and through the cable port 38-A defined by the bushing 32-A. Similarly, the ends of the cable subset 70-B1 connects to a bottom right-hand region of the communications interface 24, and the cable subset 70-B1 runs from that bottom right-hand region across the bottom of the frame portion 30 and through the cable port 38-B defined by the bushing 32-B. The ends of the cable subset 70-B2 connects to a top right-hand region of the communications interface 24, and the cable subset 70-B2 runs from that top right-hand region across the top of the frame portion 30, down the right-side of the frame portion 30 and through the cable port 38-B defined by the bushing 32-B. Accordingly, the cables 70 connecting to the communications interface 24 can be positioned so that they run substantially along the periphery of the frame portion 30 to enable a user to maintain access to the inside 72 of the chassis 22 through a central region of the access port 40.

In one arrangement, when the cables 70 are properly installed within the cable management system 20, the cables 70 pass only through the cable ports 38 and not through the access port 40. Accordingly, the user can then mount the cover portion 34 over the access port 40 (e.g., using hardware as shown in FIG. 1) to further enclose the cable management system 20 (e.g., to protect the circuitry within the chassis 20 from inadvertent damage from external objects, to prevent tampering, to form an EMI shield that reduces EMI emissions from the circuitry within the chassis 20, etc.). Further details of the invention will now be provided with reference to FIG. 4.

Figure 4:
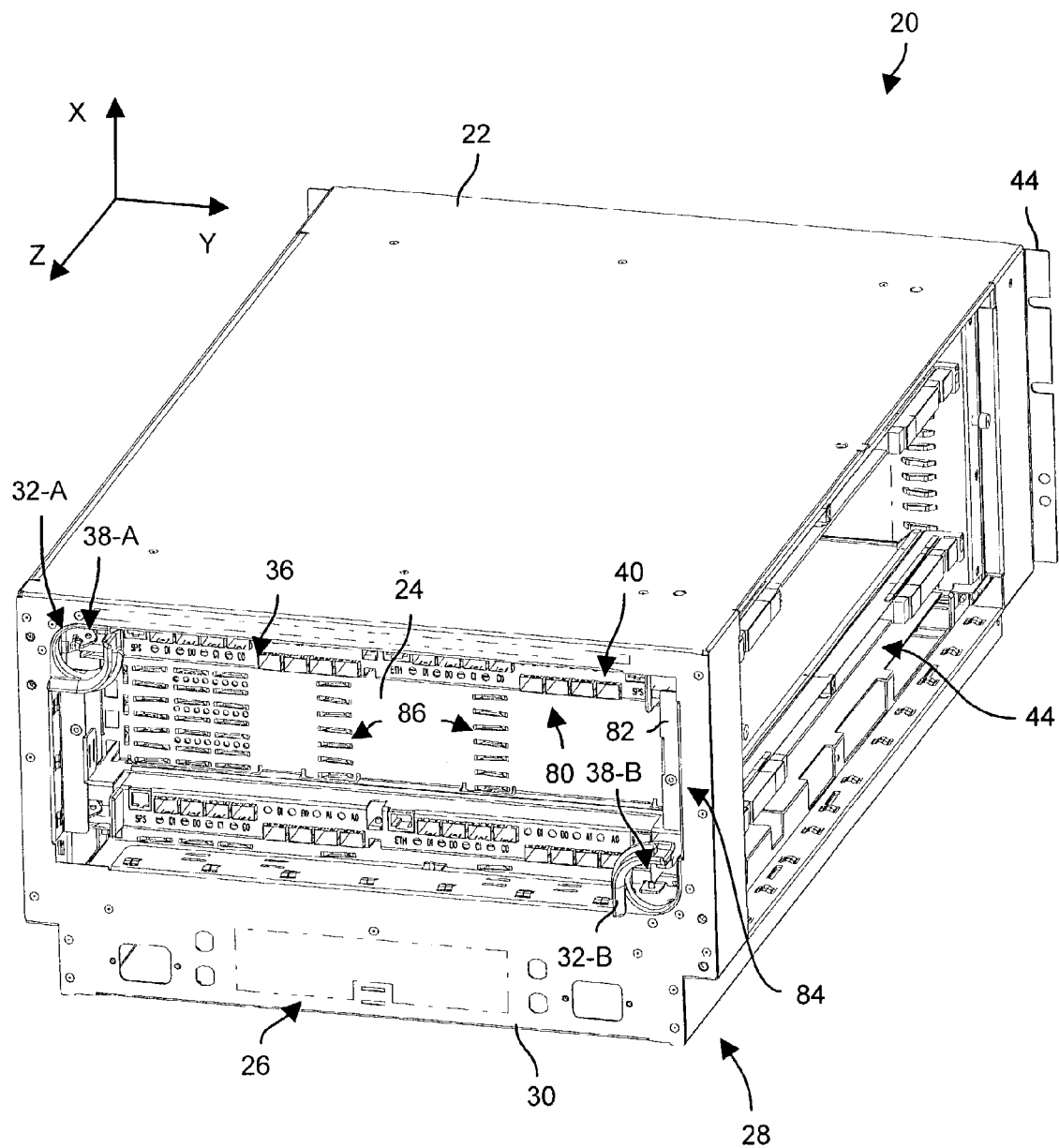
FIG. 4 is a perspective view of the cable management system of FIG. 1 when a cover portion of the access panel assembly is removed.

FIG. 4 is a perspective view of the cable management system 20 when both the cover portion 34 and the set of cables 70 are removed. The communications interface 24 is clearly visible through the frame opening 36. As shown and by way of example, the communications interface 24 provides a rigid support scaffold with connector holes 80 defined therein. Accordingly, a user can insert the cable ends 76 (e.g., fiber optic connectors) of the cables 70 (also see FIG. 3) through the connector holes 80 and into corresponding connectors (e.g., optical transducers) of the set of circuit boards 44.

It should be understood that a variety of structures can be disposed in the vicinity of the frame opening 36. For instance, by way of example, the frame portion 22 is configured with flanges 82 having screw holes 84 to receive the hardware 42 which mounts the cover portion 34. Also by way of example, cable tie structures 86 (e.g., hook-and-look straps, clips, etc.) are disposed around the frame opening 36 and are configured to hold the cables 70 in fixed, stable positions (e.g., tied down positions) to further organize the cables 70 and prevent any inadvertent and unwanted cable movement. It should be understood that the cable tie structures 86 can be configured to position the cables 70 in arrangements other than that shown in FIG. 3, such as in columns as shown by the columnar arrangement of the cable tie structures 86 in FIG. 4. Further details of the invention will now be provided with reference to FIG. 5.

Figure 5:
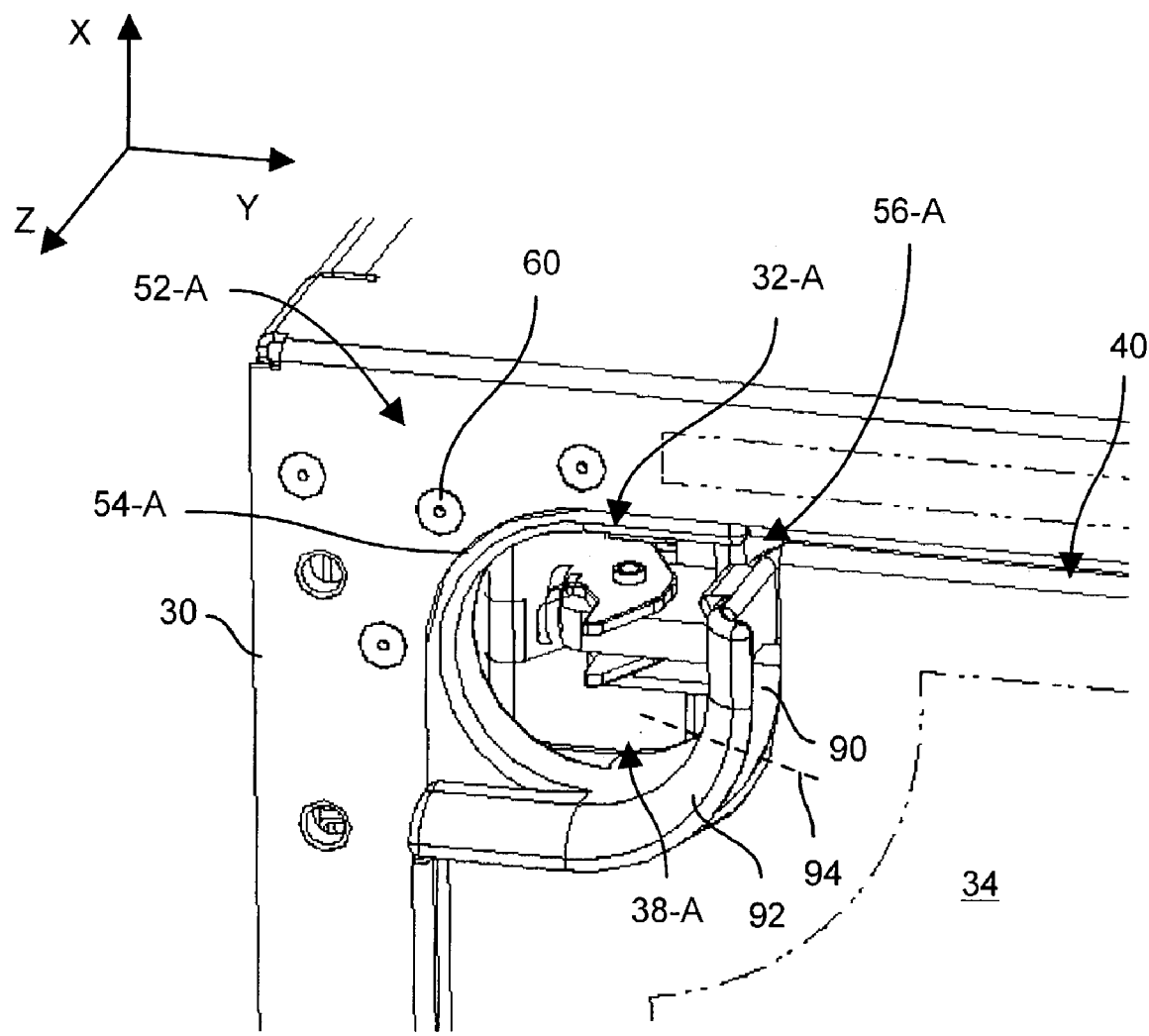
FIG. 5 is a detailed view of a bushing of the access panel assembly of the cable management system of FIG. 1.

FIG. 5 is a detailed view of one of the bushings 32-A. As shown, the bushing 32-A defines the slot 56-A which enables a user to transfer a mid-portion of a cable 70 (FIG. 3) between the cable port 38-A and the access port 40 which is covered by the cover portion 34 in FIG. 5. Accordingly, the user can conveniently connect the cable 70 through the access port 40, and then move the cable 70 so that it subsequently passes through the cable port 38-A rather than the access port in order to enable installation of the cover portion 34 over the access port 40.

As further shown in FIG. 5, the cover portion 34 includes an edge 90 which is configured to abut the bushing 38-A when the cover portion 34 is properly installed within the cable management system 20. In particular, the bushing 32-A includes a flange portion 92 that overlaps the edge 90 of the cover portion 34. Accordingly, the flange portion 92 in combination with the cover portion edge 90 provides a robust EMI seal that prevent leakage of EMI signals therebetween.

In some arrangements, the flange portion 92 has a wide radius (e.g., one inch). Accordingly, there is little likelihood that cables 70 passing through the cable port 38-A in the Z-direction (i.e., the direction which is substantially perpendicular to the X-Y plane of the cover portion 34 and of the frame opening 36) will be damaged. In particular, there is little risk of kinking the cables 70, snagging the cables 70 and/or scrapping insulation off of the cables 70. In one arrangement, the wide radius of the flange portion 92 is greater than or equal to the minimal radius permitted for the cables passing through the cable port 38-A. For example, if the cables 70 are fiber optic cables which are not to bend sharper than a particular radius, the flange portion 92 has at least that radius to prevent such bending at the point of passing through the cable port 38-A.

It should be understood that the above-provided description of the bushing 32-A also similarly applies to the bushing 32-B, and perhaps other bushings 32 if the cable management system 20 includes more than two bushings 32. Further details of the invention will now be provided with reference to FIG. 6.

Figure 6:
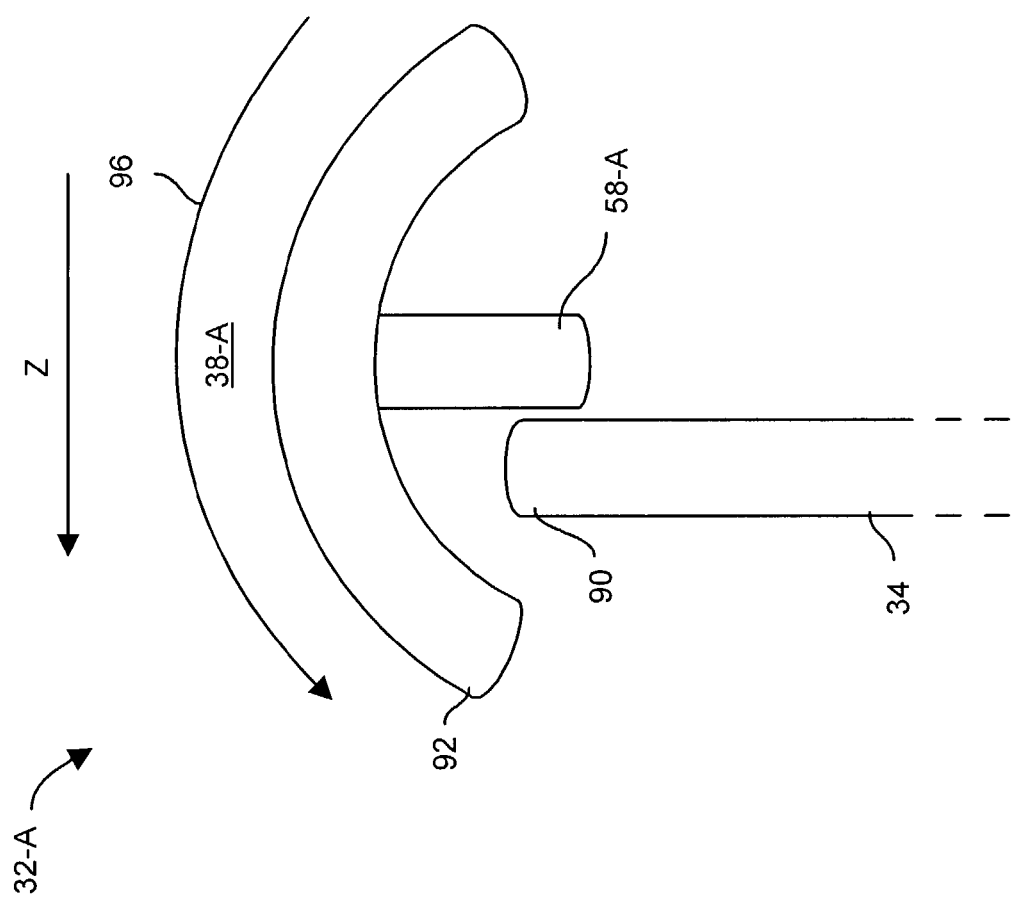
FIG. 6 is a cross-sectional view of part of the bushing of FIG. 5 and part of the cover portion.

FIG. 6 is a cross-sectional view of part of the bushing of FIG. 5 and part of the cover portion through the dashed line 94 in FIG. 5. As shown in FIG. 6, the edge 90 of the cover portion 34 overlaps the extension 58-A of the bushing 32-A and, to a partial degree, also overlaps the end of the flange portion 92. Accordingly, a tight EMI seal exists between the cover portion 34 and the bushing 32-A. It should be understood that, in at least some arrangements, a similar seal exists for other bushings 32 of the cable management system 20 as well (e.g., for the bushing 32-B in FIG. 1).

The wide radius of the bushing 32-A provides cables passing through the cable port 38-A in the Z-direction with a wide arc 96. Accordingly, the cables 70 are unlikely to kink or bend sharply beyond their minimum prescribed radius. Further details of the invention will now be provided with reference to FIG. 7.

Figure 7:
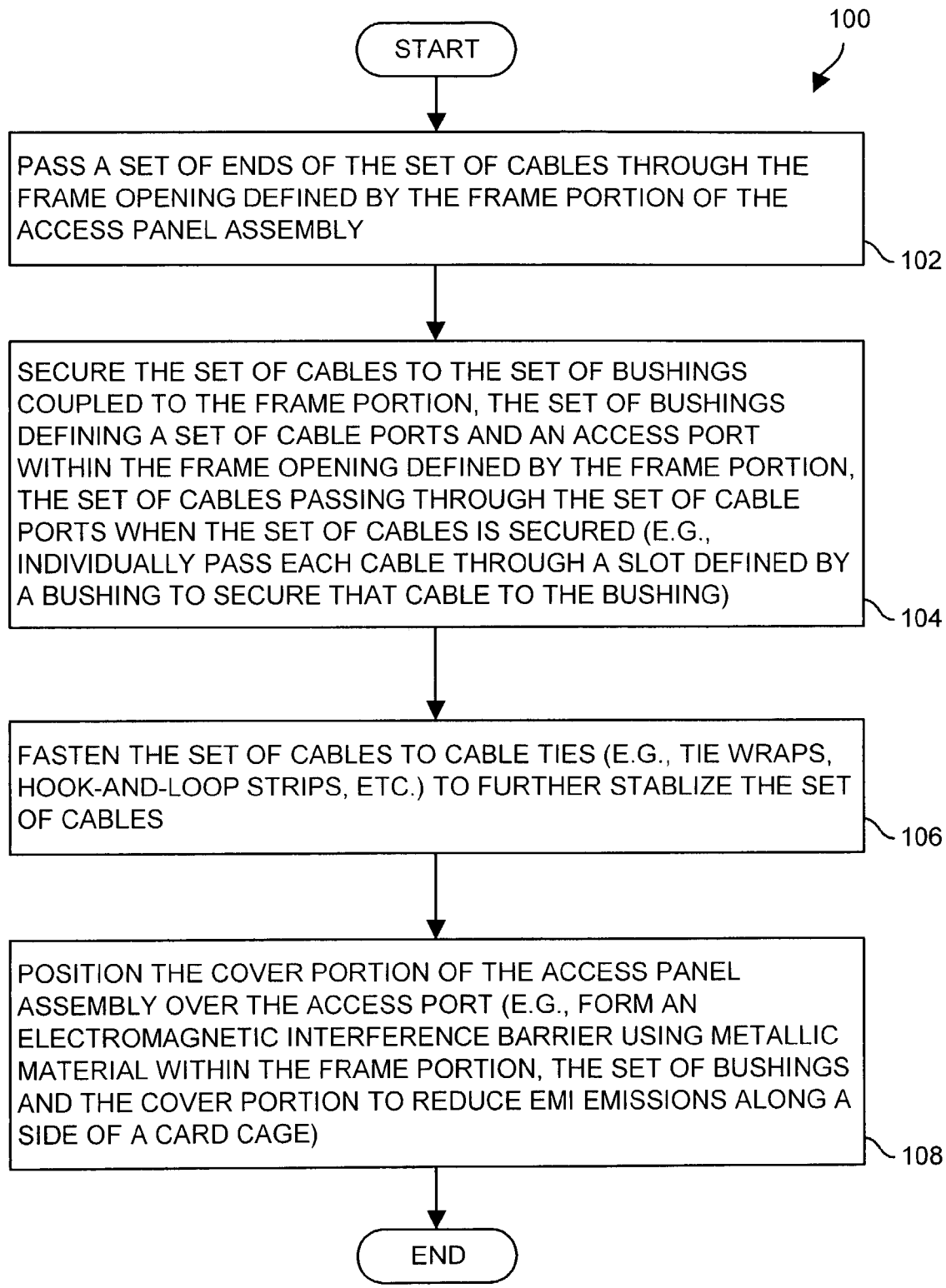
FIG. 7 is a flowchart of a procedure which is performed by a user of the cable management system of FIG. 1.

FIG. 7 is a flowchart of a procedure 100 which is performed by a user of the cable management system 20 of FIG. 1 when configuring the cable management system 20 to manage the set of cables 70. In step 102, the user passes the set of ends 76 of the set of cables 70 through the frame opening 36 defined by the frame portion 30 of the access panel assembly 28. Since the access port 40 is larger than the cable ports 38, the user can enjoy the convenience of connecting the cable ends 76 (e.g., connectors) to the communications interface 24. The user does not need to feed the cable ends 76 through the cable ports 38.

In step 104, the user secures the set of cables 70 to a set of bushings 32 coupled to the frame portion 30. In particular, the user individually passes the mid-portions 78 of the cables 70 through the slots 56 defined by the bushings 32. In some arrangements, the user completes step 102 before proceeding to step 104. In other arrangements, the user performs steps 102 and 104 at least somewhat concurrently (e.g., connects one cable 70 then slips the mid-portion 78 of that cable 70 through a slot 56 of a bushing 32, connects another cable 70 then slips the mid-portion 78 of the other cable 70 through a slot 56 of a bushing 32, and so on).

In step 106 (which is optional), the user fastens the set of cables 70 to the cable ties 86 (e.g., hook-and-loop strips, tie wraps, etc.) to further stabilize the set of cables 70 in an orderly manner (e.g., so that the cables 70 run along the sides of the frame opening 36 or in columns, etc.). The cable ties 86 are preferably configured to selectively fasten and unfasten with the cables 70 to enable later removal of one or more cables 70 in the future (e.g., during reconfiguration or cable replacement).

In step 108, the user positions the cover portion 34 of the access panel assembly 26 over the access port 40 and secures the cover portion 34 to the frame portion 30 (e.g., using hardware). As a result, the cover portion 34 protects the circuitry within the chassis 20 (e.g., the set of circuit boards 44, see FIG. 1) from inadvertent damage from external objects as well as against tampering. In one arrangement, the frame portion 30, the bushings 32 and the cover portion 34 include metallic material to create an EMI barrier along the side 28 of the chassis 20 to decrease EMI emissions from the circuitry within the chassis 20.

As described above, the invention is directed to techniques for managing a set of cables 70 (e.g., fiber optic cables, electrical signal cables, combinations thereof, etc.) using a set of bushings 32 that defines both a set of cable ports 38 and an access port 40 within a frame opening 36. Accordingly, the frame opening 36 is well-suited for both positioning the cables 70 (e.g., through the set of cable ports 38), as well as for providing other forms of access (e.g., manual access through the access port 40 by a technician when plugging or unplugging cable ends) in a well-organized manner.

While this invention has been particularly shown and described with references to preferred embodiments thereof, it will be understood by those skilled in the art that various changes in form and details may be made therein without departing from the spirit and scope of the invention as defined by the appended claims.

For example, it should be understood that the chassis 22 of the cable management system 20 was described above as being configured for installation within an electronic equipment rack (i.e., configured for rack mounting) by way of example only. In other arrangements, the chassis 22 is configured for installation in other settings (e.g., a computer cabinet, an equipment closet, etc.).

Additionally, it should be understood that the chassis 22 was described above as being a card cage for carrying a set of circuit boards 44 in parallel manner by way of example only. In other arrangements, the chassis 22 has other configurations such as being a cabinet itself or being a small profile equipment housing (e.g., a computer tower, a pizza-box-shaped container, etc.). In some arrangements, the chassis 22 mounts to a set of guides or rollers which enable the chassis 22 to slide in and out of an electronic equipment rack or cabinet.

Furthermore, it should be understood that the communications interface 24 was described above as being a scaffold-like structure for holding connectors while fiber ends mated with corresponding connectors on the circuit boards 44. In other arrangements, the communications interface 24 provides other operations (e.g., is an electrical backplane, is a fiber optic backplane, is a patch panel, is an array of connectors, combinations thereof, etc.).

Additionally, it should be understood that the cable ties 86 were shown as being disposed on the communications interface 24 by way of example only. In other arrangements, the cable ties 86 are fastened to other parts of the cable management system 20 such as the frame portion 30, the bushings 32, etc.

What is claimed is:

1. A cable management system, comprising:
    a chassis which is configured to hold a set of circuit boards;
    a communications interface disposed adjacent a side of the chassis; and
    an access panel assembly coupled to the side of the chassis and disposed adjacent the communications interface, the access panel assembly including (i) a frame portion which defines a frame opening, (ii) a set of bushings coupled to the frame portion, the set of bushings defining a set of cable ports and an access port within the frame opening defined by the frame portion, and (iii) a cover portion which is configured to substantially cover the access port defined by the set of bushings.

2. The cable management system of claim 1 wherein each of (i) the frame portion, (ii) the set of bushings and (iii) the cover portion of the access panel assembly includes metallic material to form an electromagnetic interference barrier.

3. The cable management system of claim 2 wherein each bushing of the set of bushings defines a slot adapted to permit a mid-portion of a cable to pass between the access port and a respective cable port of the set of cable ports while the mid-portion of that cable continues to extend through the frame opening.

4. The cable management system of claim 2 wherein the frame portion defines the frame opening, the frame opening including a substantially rectangular area; and wherein each bushing of the set of bushings is disposed in a respective corner of the substantially rectangular area defined by the frame portion.

5. The cable management system of claim 2 wherein each bushing of the set of bushings defines (i) a respective aperture, as one of the set of cable ports, in an X-Y plane, and (ii) a surface adapted to substantially support a set of cables passing through that respective aperture in a Z-direction which is substantially perpendicular to the X-Y plane, the surface having a radius which is substantially greater than or equal to one inch.

6. The cable management system of claim 5 wherein the cover portion of the access panel assembly substantially extends in the X-Y plane; and wherein each bushing includes a flange portion having the surface, at least part of that flange portion overlapping part of the cover portion in the X-Y plane.

7. The cable management system of claim 2 wherein the frame portion includes a rigid metallic edge that defines the frame opening, and wherein each bushing of the set of bushings includes a rigid metallic structure which rigidly fastens to the rigid metallic edge of the frame portion.

8. The cable management system of claim 2, further comprising:
    cable ties which are configured to hold a set of cables in stable positions, each cable tie being coupled to one of the chassis, the communications interface and the access panel assembly.

9. The cable management system of claim 1 wherein the access port defined by the set of bushings has a height and width which are sized to enable (i) a typical user's hand and (ii) a cable connector to pass entirely therethrough prior to the cover portion substantially covering the access port.

10. The cable management system of claim 1 wherein the access panel assembly includes, as the set of bushings, multiple metallic bushings; and wherein the cover portion is adapted to reside between the multiple bushings to form, in combination with the multiple metallic bushings, a portion of a Faraday cage.

11. The cable management system of claim 1 wherein the chassis is configured to hold each circuit board in a plane which is substantially perpendicular to a plane defined by the access panel assembly.

12. An access panel assembly, comprising:
    a frame portion which defines a frame opening;
    a set of bushings coupled to the frame portion, the set of bushings defining a set of cable ports and an access port within the frame opening defined by the frame portion; wherein the access panel assembly includes, as the set of bushings, multiple metallic bushings; and
    a cover portion which is configured to substantially cover the access port defined by the set of bushings.

13. The access panel assembly of claim 12 wherein each of (i) the frame portion, (ii) the set of bushings and (iii) the cover portion includes metallic material to form an electromagnetic interference barrier.

14. The access panel assembly of claim 13 wherein each bushing of the set of bushings defines a slot adapted to permit a mid-portion of a cable to pass between the access port and a respective cable port of the set of cable ports while the mid-portion of that cable continues to extend through the frame opening.

15. The access panel assembly of claim 13 wherein the frame portion defines the frame opening, the frame opening including a substantially rectangular area; and wherein each bushing of the set of bushings is disposed in a respective corner of the substantially rectangular area defined by the frame portion.

16. The access panel assembly of claim 13 wherein each bushing of the set of bushings defines (i) a respective aperture, as one of the set of cable ports, in an X-Y plane, and (ii) a surface adapted to substantially support a set of cables passing through that respective aperture in a Z-direction which is substantially perpendicular to the X-Y plane, the surface having a radius which is substantially greater than or equal to one inch.

17. The access panel assembly of claim 16 wherein the cover portion substantially extends in the X-Y plane; and wherein each bushing includes a flange portion having the surface, at least part of that flange portion overlapping part of the cover portion in the X-Y plane.

18. The access panel assembly of claim 13 wherein the frame portion includes a rigid metallic edge that defines the frame opening, and wherein each bushing of the set of bushings includes a rigid metallic structure which rigidly fastens to the rigid metallic edge of the frame portion.

19. The access panel assembly of claim 13, further comprising:

cable ties which are configured to hold a set of cables in stable positions, each cable tie being coupled to the frame portion.

20. The access panel assembly of claim 12 wherein the access port defined by the set of bushings has a height and width which are sized to enable (i) a typical user's hand and (ii) a cable connector to pass entirely therethrough prior to the cover portion substantially covering the access port.

21. The access panel assembly of claim 12 wherein the cover portion is adapted to reside between the multiple bushings to form, in combination with the multiple metallic bushings, a portion of a Faraday cage.

22. The access panel assembly of claim 12 wherein each of the multiple metallic bushings includes a metallic coating for electromagnetic interference shielding.

* * * * *